United States Patent
Conta et al.

(10) Patent No.: US 7,659,774 B2
(45) Date of Patent: Feb. 9, 2010

(54) FILTER CIRCUIT

(75) Inventors: Matteo Conta, Irvine, CA (US); Andrea Baschirotto, Tortona (IT); Stefano D'Amico, Corsano (IT)

(73) Assignee: Glonav Limited, Dublin (IE)

( * ) Notice: Subject to any disclaimer, the term of this patent is extended or adjusted under 35 U.S.C. 154(b) by 7 days.

(21) Appl. No.: 11/795,746

(22) PCT Filed: Sep. 25, 2006

(86) PCT No.: PCT/GB2006/003560

§ 371 (c)(1),
(2), (4) Date: Jul. 20, 2007

(87) PCT Pub. No.: WO2007/034222

PCT Pub. Date: Mar. 29, 2007

(65) Prior Publication Data

US 2008/0157864 A1     Jul. 3, 2008

(51) Int. Cl.
*H03B 1/00*     (2006.01)
*H03K 5/00*     (2006.01)
*H04B 1/10*     (2006.01)
(52) U.S. Cl. ........................................... 327/552
(58) Field of Classification Search ............... 327/552
See application file for complete search history.

(56) References Cited

U.S. PATENT DOCUMENTS 4,475,087 A * 10/1984 Nagano .................... 330/288
5,950,115 A * 9/1999 Momtaz et al. ............ 455/73

OTHER PUBLICATIONS

"High speed fully differential I/O amplifiers" Texas Instruments Data Sheet, No. SLOS319D, Oct. 2004, XP009079777, Dallas, Tx, USA, Figure 18.*

* cited by examiner

*Primary Examiner*—Lincoln Donovan
*Assistant Examiner*—Daniel Rojas
(74) *Attorney, Agent, or Firm*—John Bruckner PC

(57) ABSTRACT

The present invention addresses a need for reducing the power consumption in a baseband filter used in a front-end wireless receiver while providing the necessary linearity. In particular, relatively high linearity can be obtained with lower power consumption than has heretofore been the case. This is achieved in embodiments of the invention using an optimized single-branch fully differential structure which operates as a "composite" source-follower (when using CMOS devices) with an ideal unitary dc gain. A positive feedback internal to the source follower allows one to synthesize two complex-poles.

12 Claims, 1 Drawing Sheet

FILTER CIRCUIT

TECHNICAL FIELD

The present invention relates to a filter circuit. More particularly, the invention relates to an active filter incorporating a voltage follower which provides for linearity to be obtained at a desired level with reduced power consumption. Embodiments of the invention may be particularly suitable for filtering a very low level baseband frequency signal before it is further processed in a communications system or device.

BACKGROUND TO THE INVENTION

The increasing demand of portable terminals for wireless communications with improved services forces the development of better block solutions. For instance the reduction of the power consumption of each block becomes of fundamental importance, since it would give some power available for new services. The case of the baseband continuous-time filter in the receiver is here addressed.

Well known filter implementations are the ones based on Active-RC and Active-Gm-RC architectures which guarantee high linearity but with a larger power consumption than with Gm-C filter architecture which, however, suffer from reduced linearity.

In light of the above, there exists a need for a new filter architecture that guarantees high linearity while minimizing power consumption.

SUMMARY OF THE INVENTION

The present invention addresses a need for reducing the power consumption in a baseband filter used in a front-end wireless receiver while providing the necessary linearity. In particular, relatively high linearity can be obtained with lower power consumption than has heretofore been the case. This is achieved in embodiments of the invention using an optimized single-branch fully differential structure which operates as a "composite" source-follower (when using CMOS devices) with an ideal unitary dc gain. A positive feedback internal to the source follower allows one to synthesize two complex-poles.

In view of the above, from a first aspect the invention provides a filter circuit, comprising: a) a differential input stage; b) a voltage follower stage configured to receive at least one input from the differential input stage; and c) one or more reactive components. Preferably, the filter circuit includes means to provide positive feedback whereby to provide complex-pole synthesis. Even more preferably, the means to provide positive feedback is provided in the voltage follower stage.

This architecture presents the key advantage of the source-follower: as any feedback structure its linearity improves with a large closed-loop gain. This means that larger is the gm better is the linearity. This basic result completely differs from Active-RC and Gm-C filters, where the linearity is improved for large Vov of the input devices. Breaking the dependence Vov-vs-linearity has immediately large impact on the filter performance. Minimizing Vov corresponds to reduce the current level (and then the power consumption) to achieve a given gm value. This is reflected in a significant power reduction for the same linearity.

Additionally, the use of a voltage follower stage provides a low output impedance which allows the filter to drive a moderate resistive load or switched-capacitor without substantially modifying the filter linearity or transfer function.

Moreover, the arrangement of the differential input stage and voltage follower means that no common mode feedback (CMFB) circuit is required in the filter stage, thus saving components, PCB space, and cost.

Furthermore, whilst the above architecture reduces power consumption, it does not do so at the cost of circuit performance. In particular the above arrangement particularly allows for the same or a larger device transconductance (gm) to be obtained for reduced current than has heretofore been the case. Achieving a relatively large gm with a lower current provides for improved noise performance, and also allows the use of a larger capacitor for a given filter pole frequency, thus giving further robustness to the filter circuit against parasitic capacitances.

From a second aspect, the invention also provides a system comprising: a bi-quadratic filter cell having a differential current branch comprising four transistors and two capacitances; and means to provide positive feedback to two of the four transistors, whereby to obtain resonance necessary for the complex-pole synthesis.

Moreover, the invention also provides a system comprising: a compact structure for a full low power bi-quadratic filter that is part of a radio frequency front end; and a full bi-quadratic filter cell that has only 1 differential current branch composed by only 4 transistors and 2 capacitances; and a method to obtain the resonance, necessary for the complex-pole synthesis, by the means of the positive feedback of 2 of the 4 transistors.

Further features and aspects will be apparent from the appended claims.

BRIEF DESCRIPTION OF THE DRAWINGS

Further features and advantages of the present invention will become apparent from the following description of embodiments thereof, presented by way of example only, and by reference to the drawings, wherein like reference numerals refer to like parts, and wherein.

DESCRIPTION OF THE EMBODIMENTS

In accordance with embodiments of the invention, a low-power bi-quadratic filter comprises an optimized single-branch fully differential structure and operates as a "composite" voltage follower (with an ideal unitary DC gain).

Figure 1:
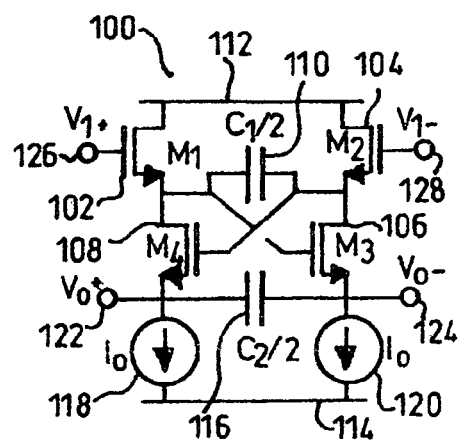
FIG. 1 is a circuit diagram of a low power bi-quadratic filter in accordance with a first embodiment of the invention.

A first filter circuit 100 forming a first embodiment of the invention is shown in FIG. 1.

The filter circuit 100 comprises a first power rail (referred to hereafter as the supply rail) 112 comprising the supply voltage, and a second power rail (referred to hereafter as the ground rail) 114 of opposite polarity to act as the negative or 0 volts rail. A first current path is formed between the supply rail 112 and the ground rail 114, the path comprising a first MOSFET 102 (M1), and a second MOSFET 108 (M4). The drain of FET 102 is connected to the supply rail 112, the source of the FET then being connected to the drain of second MOSFET 108 (M4). The source of the second MOSFET 108 (M4) is then connected via current source 118 supplying current $I_0$ to the ground rail 114. The gate terminal of first MOSFET 102 (M1) provides an input terminal 126, which acts as the positive input terminal for a differential input stage.

A second current path is also provided between supply rail 112 and ground rail 114, comprising third MOSFET 104 (M2), the drain of which is connected to the supply rail 112. A fourth MOSFET 106 (M3) is further provided, the drain of which is connected to the source of the third MOSFET 104 (M2). The source of the fourth MOSFET 106 (M3) is connected to the ground rail 114 via a second current source 120, configured to provide a current $I_0$. The gate of third MOSFET 104 (M2) provides a second input terminal 128, to act as the negative input of the differential input stage mentioned earlier.

The two circuit paths described above are connected together as follows. The source terminal of the first MOSFET 102 (M1) is connected to the gate terminal of the fourth MOSFET 106 (M3). Similarly, the source of the third MOSFET 104 (M2) is connected to the gate of the second MOSFET 108 (M4). Additionally, a capacitive coupling is provided between the respective source terminals of the first and third MOSFETs 102 (M1) and 104 (M2) respectively, in the form of capacitor 110, having value $C_1/2$. Due to the connections between the respective sources of the first and third MOSFETs, and the respective gates of the second and fourth MOSFETs, the capacitive coupling therefore also capacitively connects the respective gates of the second and fourth MOSFETs.

The filter circuit provides a differential output, at positive output terminal 122, which is connected to the source of the second MOSFET 108 (M4). A negative output terminal 124 is provided connected to the source terminal of the fourth MOSFET 106 (M3). A further capacitive coupling is provided connecting these respective output terminals (and hence the respective source terminals of the second and fourth devices) in the form of further capacitor 116, which takes value $C_2/2$. The values $C_1/2$ and $C_2/2$ are selected to give the desired break frequency of the filter, calculated in accordance with Equation 2 below.

The circuit therefore comprises a differential input stage formed from devices 102 (M1) and 104 (M2) which respectively provide differential inputs, and, at their source terminals, differential outputs. Following the differential input stage, however, devices 108 and 106 act as a voltage follower stage, being in this case, due to the MOSFET architecture, a source follower stage. As is known, voltage followers supply current gain and some power gain, but have a voltage gain which is ideally unitary, and have a low output impedance. Moreover, voltage followers typically have a high input impedance, thus making them valuable as a buffer or impedance matching stage. In terms of the context of the present embodiment, however, i.e. providing an active filter which consumes relatively less power with substantially the same performance, the further advantages of the use of the source follower stage are discussed below.

More particularly, as shown in FIG. 1, a positive feedback (always stable due to the presence of the MOS output impedance) internal to the source follower (M4 & M3) allows one to synthesize two complex-poles. If the transistors' output conductance is much larger than the transconductance, and gm1=gm4=gm2=gm3, the filter transfer functions is:

$$H(s) = -\frac{1}{s^2 \frac{C_1 C_2}{(g_{m1})^2} + s \frac{C_1}{g_{m1}} + 1} \quad \text{Equation 1}$$

The filter parameters ($\omega$n is the pole frequency, Q is the quality factor while K is the DC-gain) then become:

$$\omega_0 = 2\pi f_0 = \frac{g_{m1}}{\sqrt{C_1 C_2}} \quad \text{Equation 2}$$

$$Q = \sqrt{\frac{C_2}{C_1}} \quad \text{Equation 3}$$

$$|K| = 1 \quad \text{Equation 4}$$

Figure 2:
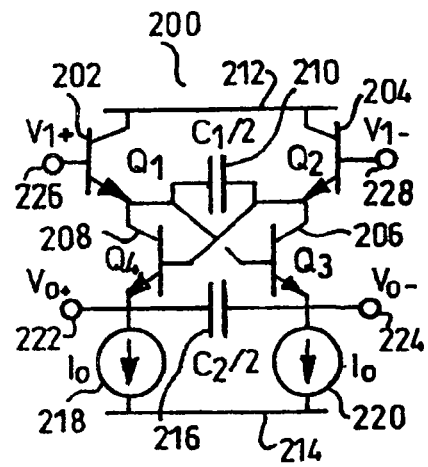
FIG. 2 is a circuit diagram of a low power bi-quadratic filter in accordance with a second embodiment of the invention.
Figure 3:
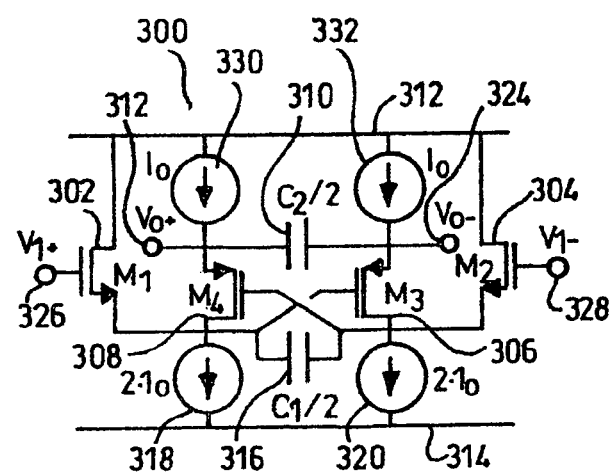
FIG. 3 is a circuit diagram of a low power bi-quadratic filter in accordance with a third embodiment of the invention.

This structure presents the key advantage of the source-follower: as any feedback structure, its linearity improves with a large closed-loop again (given by gm.Rout, where Rout is the $I_0$ current source output impedance and gm is the input device transconductance). This means that larger is the gm (achieved for lower Vov) better is the linearity. This basic conclusion completely differs from Active-RC and Gm-C filters, where the linearity is improved for large Vov of the input devices. Breaking the dependence Vov-vs-linearity has an immediately large impact on the filter performance. Minimizing Vov corresponds to reducing the current level (and the power consumption) to achieve a given gm value. This is reflected in a significant power reduction for the same linearity. In addition, the 1/Vov dependence of the gm magnifies this effect. Achieving a large gm with a lower current also provides excellent noise performance and allows the use of a larger capacitor for a given pole frequency, thus giving more robustness with regard to parasitic capacitance to the structure performance. Since the target is getting a high gm, despite the low Vov, the structure can be implemented with large linearity also with BJT devices, as shown in FIG. 2, discussed in more detail below. FIG. 3 shows the MOS folded version. However in this structure the linearity is fixed by the operation of M3 and M4 (which can operate also in linear region and then allow a swing equal about to VTH+Vov) and by the high-impedance of the current source $I_0$.

As mentioned above, the circuit of the first embodiment can also be implemented using bi-polar junction transistors, as shown in FIG. 2. Here, according to a second embodiment of the invention a filter circuit 200 is provided having a supply rail 212 and a ground rail 214. A first current path is provided between supply rail 212 and ground rail 214 comprising a first BJT device 202 (Q1) the collector of which is connected to the supply rail, and the base terminal of which provides an input terminal 226, being the positive input of a differential input stage. The emitter of BJT 202 (Q1) is connected to the collector terminal of a second BJT device 208 (Q4) the emitter of which is connected to the ground rail 214, via a current source 218, supplying current $I_0$. As in the first embodiment, a second current path is also formed, comprising third BJT device 204 (Q2) the collector of which is connected to the supply rail 212, and the emitter of which is connected to the collector of a fourth BJT device 206 (Q3). The emitter of device Q3 is connected to the ground rail 214 via a second current source 220, supplying current $I_0$. The base terminal of the third transistor 204 (Q2) provides a second input terminal 228, to act as the negative input to the differential input stage.

As in the first embodiment, the emitter terminal of the first device 202 (Q1) is connected to the base terminal of the fourth device 206 (Q3), and the emitter of the third device 204 (Q2) is connected to the base of the second device 208 (Q4). Additionally, a capacitive coupling in the form of capacitor 210 having value $C_1/2$ is provided connecting the respective emitter terminals of the first and third devices 202 and 204 (Q1 and Q2) respectively. Additionally, a second capacitive coupling in the form of second capacitor 216 taking value $C_2/2$ is provided between the respective emitter terminals of the second and fourth devices 208 and 206. The values of the capacitors are selected to give the desired break-frequency of the filter, as described previously in respect of the first embodiment.

A first output terminal 222 forming a positive differential output is provided connected to the emitter terminal of the second device 208, whereas a second output terminal 224 providing a negative differential output is provided connected to the emitter terminal of the fourth device 206. Thus, as in the first embodiment, within the filter circuit 200 of the second embodiment a differential input stage is provided by the first and third devices 202 and 204, the differential input stage then being followed by a voltage follower stage in the form of emitter followers 208 and 206. The output of the circuit is then taken from the output terminals of the respective emitter followers.

The filter circuit 200 of the second embodiment essentially has the same characteristics as the filter circuit 100 of the first embodiment, discussed previously. Thus, the advantages of the present invention in terms of being able to provide a lower power active filter then were heretofore available can be obtained irrespective of the silicon technology i.e. MOSFET, or BJT, which is to be used.

FIG. 3 illustrates a third embodiment of the present invention, being in this case a filter circuit 300 implemented using a folded MOS architecture. Here, the filter circuit 300 comprises a supply rail 312 and a ground rail 314. The differential input stage here comprises first MOSFET device 302 (M1) and second MOSFET device 304 (M2), the respective drains of which are connected to the supply rail 312. The respective gates provide input terminals 326 and 328, input 326 at the gate of device 302 providing a positive differential input, and input 328 at the gate of device 304 providing a negative differential input.

A voltage follower circuit in the form of a source follower is provided by additional MOSFETs, and in particular third MOSFET 306 (M3), and fourth MOSFET 308 (M4). Respective source terminals of devices 306 and 308 are connected to the supply rail 312 via respective current sources 332 and 330, each supplying current $I_0$. Additionally, the respective drain terminals of devices 306 and 308 are connected to the ground rail 314 by respective current sources 320 and 318, both providing currents $2.I_0$. In order to set the filter breakpoint, reactive components in the form of capacitive couplings are provided, with in this case a first capacitor 316 being connected between the respective source terminals of the first and second MOSFETs 302 and 304 (and hence between the respective gate terminals of the third and fourth MOSFETs), and a second capacitive coupling in the form of capacitor 310 being provided connected between the respective source terminals of the third and fourth devices 306 and 308. The first capacitor 316 takes a value $C_1/2$, and the second capacitor 310 takes the value of $C_2/2$. Within the present embodiment, as with the previous embodiment, the values for $C_1$ and $C_2$ are chosen depending upon the desired break frequency for the filter.

As with the preceding embodiments, therefore, the filter circuit 300 according to the third embodiment comprises a differential input stage in the form of first and second devices 302 and 304, together with a voltage follower output stage comprising third and fourth devices 306 and 308. Due to the MOS technology, the voltage follower output stage can more accurately be termed a source follower.

Within the third embodiment, therefore, similar advantages to those described previously in respect of the first and second embodiments are obtained. However, as mentioned earlier, within the third embodiment the linearity of the circuit is fixed by the operation of the third and fourth devices 306 and 308 (M3 and M4), which can operate within the linear region, and then allow a swing equal to about $V_{th}+V_{ov}$, and by the high impedance of the current source $I_0$.

The above described embodiments each relate to a low-pass filter, having a breakpoint determined by the values for $C_1$ and $C_2$, as discussed earlier. However, the invention is not limited to providing a low-pass filter, and in other embodiments other filter types can be provided, such as a high-pass or band-pass filter, determined by the selection of suitably valued reactive components substituted for capacitors 110, 210, or 310, and 116, 216, or 316. For example, substituting the capacitors for inductors will result in a high-pass filter, as is well-known. Other frequency responses can be obtained by selection of appropriate reactive components.

The above-described embodiments feature also the following additional advantages for reducing the power consumption:

No circuital parasitic poles are present, avoiding the power cost of pushing non-dominant singularities at high frequency.

No CMFB circuit: the output CM voltage is fixed to be two VGS1+VGS3 lower than the input CM voltage.

Low output impedance: as a source follower the filter can drive a moderate resistive load or a switched-capacitor without substantially modifying the filter linearity and transfer function.

Further modifications and additions will be apparent to the person skilled in the art, all of which are intended to be encompassed by the appended claims.

The invention claimed is:

1. A filter circuit, comprising:
   an electrical filter having a break frequency, the electrical filter including:
   a) a differential input stage comprising a first transistor (M1), a second transistor (M2), and at least one first reactive component, respective control terminals of the first and second transistors being arranged to receive a respective differential input, and respective first terminals of the first and second transistors being connected to a voltage supply;
   b) a voltage follower stage comprising a third transistor (M3), a fourth transistor (M4), and at least one second reactive component; respective control terminals of the third and fourth transistors being connected to respective second terminals of the differential input stage to provide positive feedback whereby to provide complex-pole synthesis;
   wherein the break frequency of the electrical filter is substantially defined only by the least one reactive component and the at least one second reactive component.

2. A filter circuit according to claim 1, wherein the differential input stage has a differential output provided by the respective second terminals of the first and second transistors, and wherein the at least one first reactive component is connected between the terminals of the differential output.

3. A filter circuit according to claim 1, wherein the voltage follower stage provides a differential output, and wherein the at least one second reactive component is connected between the terminals of the differential output.

4. A filter circuit according to claim 1, wherein the first and/or second reactive components are capacitors.

5. A filter circuit according to claim 1, wherein the first and second transistors are both either one of i) FETs; or ii) BJTs.

6. A filter circuit according to claim 1, respective first terminals of the third and fourth transistors being connected to respective differential output terminals of the differential input stage, each respective first terminal being connected to the opposite differential output terminal than the respective control terminal of the same transistor.

7. A filter circuit according to 6 wherein the third and fourth transistors are both either one of i) FETs; or ii) BJTs.

8. A filter circuit according to claim 1, respective first terminals of the third and fourth transistors being connected to respective first current sources, and respective second terminals being connected to respective second current sources.

9. A filter circuit according to claim 1, wherein said filter is a bi-quadratic filter.

10. A RF front-end comprising a filter circuit according to claim 1.

11. A filter circuit according to claim 1, wherein the at least one first reactive component is a capacitor having a capacitance C1/2, and the at least one second reactive component is a capacitor having a capacitance C2/2, the electrical filter having a transfer function given by;

$$H(s) = -\frac{1}{s^2 \frac{C_1 C_2}{(g_{m1})^2} + s \frac{C_1}{g_{m1}} + 1} \quad \text{Equation 1}$$

wherein gm1 is the trans-conductance of the first, second, third, and fourth transistors.

12. An apparatus comprising:
an electrical filter circuit having first, second, third, and fourth transistors, at least one first reactive component, and at least one second reactive component;
wherein the first and second transistors provide a differential input stage and in use receive differential inputs on their respective control terminals, the at least one first reactive component being connected across output terminals of the first and second transistors that provide an output of the differential input stage;
wherein the third and fourth transistors provide a voltage follower stage, a control terminal of the third transistor being connected to the output terminal of the second transistor and a control terminal of the fourth transistor being connected to the output terminal of the first transistor such that the at least one first reactive component is also connected across the respective control terminals of the third and fourth transistors, the at least one second reactive component being connected across output terminals of the third and fourth transistors; and
wherein the break frequency of the electrical filter is substantially dependent only on the first reactive component and the second reactive component.

* * * * *

UNITED STATES PATENT AND TRADEMARK OFFICE
CERTIFICATE OF CORRECTION

PATENT NO. : 7,659,774 B2  Page 1 of 1
APPLICATION NO. : 11/795746
DATED : February 9, 2010
INVENTOR(S) : Matteo Conta et al.

It is certified that error appears in the above-identified patent and that said Letters Patent is hereby corrected as shown below:

In column 8 (claim 11) replace equation 1 with:

$$H(s) = \frac{1}{s^2\left(\dfrac{C_1 C_2}{g_{m1}}\right)^2 + s\left(\dfrac{C_1}{g_{m1}}\right) + 1}$$

Signed and Sealed this

Twentieth Day of April, 2010

David J. Kappos
*Director of the United States Patent and Trademark Office*